US012776797B2

(12) United States Patent
Liu et al.

(10) Patent No.: US 12,776,797 B2
(45) Date of Patent: Oct. 27, 2026

(54) CARD TRAY ASSEMBLY AND ELECTRONIC DEVICE

(71) Applicant: VIVO MOBILE COMMUNICATION CO., LTD., Guangdong (CN)

(72) Inventors: Zhen Liu, Guangdong (CN); Shaoru Fu, Guangdong (CN)

(73) Assignee: VIVO MOBILE COMMUNICATION CO., LTD., Guangdong (CN)

(*) Notice: Subject to any disclaimer, the term of this patent is extended or adjusted under 35 U.S.C. 154(b) by 295 days.

(21) Appl. No.: 18/597,612

(22) Filed: Mar. 6, 2024

(65) Prior Publication Data

US 2024/0214019 A1 Jun. 27, 2024

Related U.S. Application Data

(63) Continuation of application No. PCT/CN2022/117253, filed on Sep. 6, 2022.

(30) Foreign Application Priority Data

Sep. 7, 2021 (CN) ......................... 202111044274.7

(51) Int. Cl.
*H04B 1/3818* (2015.01)
*H05K 7/14* (2006.01)

(52) U.S. Cl.
CPC ......... *H04B 1/3818* (2015.01); *H05K 7/1427* (2013.01)

(58) Field of Classification Search
CPC .... H04B 1/3818; H05K 7/1427; G06F 1/185; G06K 13/0825; G06K 13/0831
See application file for complete search history.

(56) References Cited

U.S. PATENT DOCUMENTS 5,899,763 A * 5/1999 Kajiura ................ H01R 13/633 439/159
6,059,588 A * 5/2000 Tung ...................... G06K 13/08 439/159

(Continued)

FOREIGN PATENT DOCUMENTS

CN 206673947 U 11/2017
CN 110739980 A 1/2020

(Continued)

OTHER PUBLICATIONS

First Office Action in JP Application No. 2024-514559 dated Nov. 25, 2024 (5 pages, including English translation).

(Continued)

*Primary Examiner* — Angelica Perez
(74) *Attorney, Agent, or Firm* — BROOKS KUSHMAN P.C.

(57) ABSTRACT

A card tray assembly and an electronic device. The card tray assembly includes: a positioning cylinder provided with a first fitting slot, a second fitting slot, and a first guide slope, where an inner surface of the first fitting slot is connected to an inner surface of the second fitting slot; a card tray provided with an action portion; and a telescopic assembly including a telescopic positioning member and an elastic member, where the telescopic positioning member is movably disposed at the positioning cylinder, at least partially located in the positioning cylinder, and provided with a positioning protrusion; and one end of the elastic member is connected to the telescopic positioning member, and the other end of the elastic member is a fixed end.

17 Claims, 10 Drawing Sheets

(56) References Cited

U.S. PATENT DOCUMENTS

| | | | | |
|---|---|---|---|---|
| 6,319,029 | B2 * | 11/2001 | Nishioka ................ | G06K 13/08 439/159 |
| 7,008,245 | B1 * | 3/2006 | Chien .................. | H01R 13/629 439/159 |
| 7,575,452 | B2 * | 8/2009 | Chikashige .......... | H01R 13/635 439/159 |
| 2004/0047134 | A1 * | 3/2004 | Liu .................... | G06K 13/0831 361/736 |

FOREIGN PATENT DOCUMENTS

| | | | | |
|---|---|---|---|---|
| CN | 113660002 | A | | 11/2021 |
| JP | 2000195587 | A | | 7/2000 |
| JP | 2012146489 | A | * | 8/2012 |
| JP | 2013073672 | A | | 4/2013 |
| WO | 2018014458 | A1 | | 1/2018 |
| WO | 2018086290 | A1 | | 5/2018 |

OTHER PUBLICATIONS

International Search Report for International Application No. PCT/CN2022/117253 mailed Nov. 25, 2022 (14 pages, including English translation).

Second Japanese Office Action for Japanese Patent Application No. 2024514559 mailed Apr. 1, 2025. 5 pages.

* cited by examiner

CARD TRAY ASSEMBLY AND ELECTRONIC DEVICE

CROSS-REFERENCE TO RELATED APPLICATIONS

This application is a continuation of International Application No. PCT/CN2022/117253 filed on Sep. 6, 2022, which claims priority to Chinese Patent Application No. 202111044274.7 filed on Sep. 7, 2021, which are incorporated herein by reference in their entireties.

TECHNICAL FIELD

This application pertains to the field of communication technologies and specifically relates to a card tray assembly and an electronic device.

BACKGROUND

Currently, electronic devices on the market are equipped with cards such as user identification cards and memory cards to meet the use requirements for the electronic devices. Correspondingly, card trays need to be provided to accommodate such cards.

However, in practical application, when it is necessary to remove a card tray from an electronic device, the conventional approach is to insert an ejection pin or a similar tool to into a card hole and apply a driving force to make the card tray pop out. However, in a case that an ejection pin is not available or lost, and no similar tool can be found, a user cannot remove a card tray from an electronic device, resulting in unpleasant user experience. Therefore, how a card tray holding a card can be conveniently removed from an electronic device has become a major concern for people.

SUMMARY

Embodiments of this application are intended to provide a card tray assembly and an electronic device.

This application is implemented as follows.

According to a first aspect, an embodiment of this application provides a card tray assembly including:

a positioning cylinder, where the positioning cylinder is provided with a first fitting slot, a second fitting slot, and a first guide slope, and an inner surface of the first fitting slot is connected to an inner surface of the second fitting slot via the first guide slope;

a card tray, where the card tray is provided with an action portion; and a telescopic assembly, where the telescopic assembly includes a telescopic positioning member and an elastic member, the telescopic positioning member is movably disposed at the positioning cylinder, the telescopic positioning member is at least partially located in the positioning cylinder, the telescopic positioning member is provided with a positioning protrusion, one end of the elastic member is connected to the telescopic positioning member, and the other end of the elastic member is a fixed end.

Under fitting between the positioning protrusion and the first guide slope, the action portion and the elastic member drive the telescopic positioning member to rotate between a first position and a second position. In a case that the telescopic positioning member is at the first position, the positioning protrusion fits with the first fitting slot in a limiting manner, and the card tray is in an extended state. In a case that the telescopic positioning member is at the second position, the positioning protrusion fits with the second fitting slot in a limiting manner, and the card tray is in a retracted state.

According to a second aspect, an embodiment of this application provides an electronic device including a housing and a card tray assembly. The housing is provided with a card tray hole, the card tray assembly is disposed at the card tray hole, and the card tray assembly is the foregoing card tray assembly.

Figure 1:
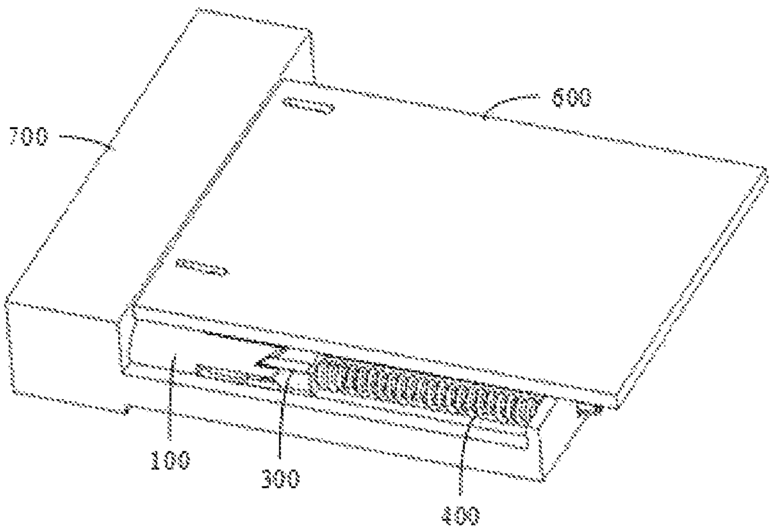
FIG. 1 is a schematic diagram of a partial structure of an electronic device according to a first embodiment of this application.
Figure 2:
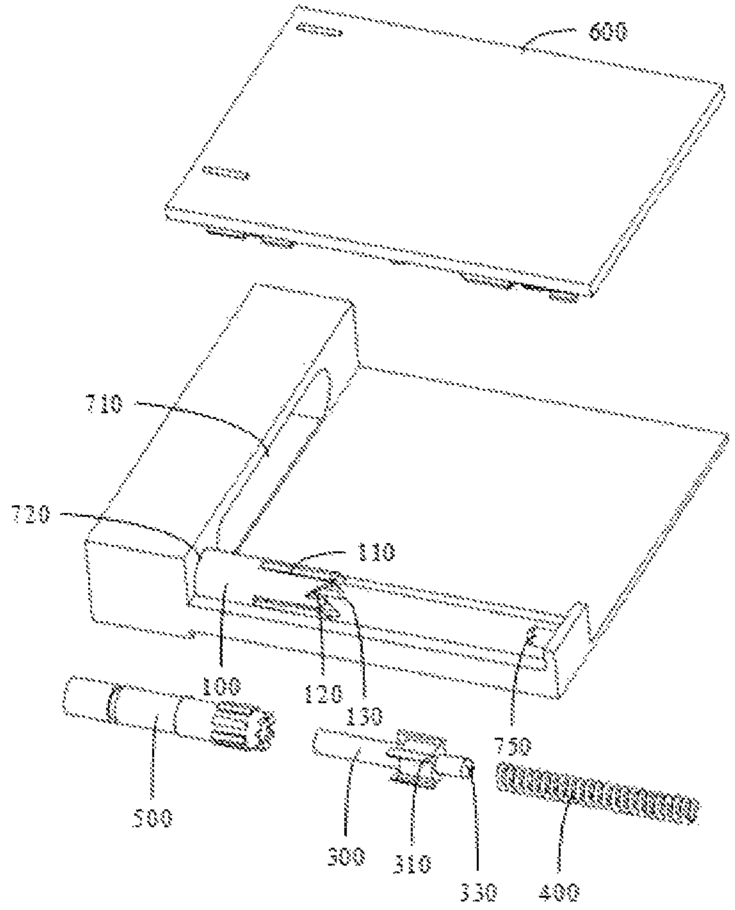
FIG. 2 is an exploded view of FIG. 1.
Figure 3:
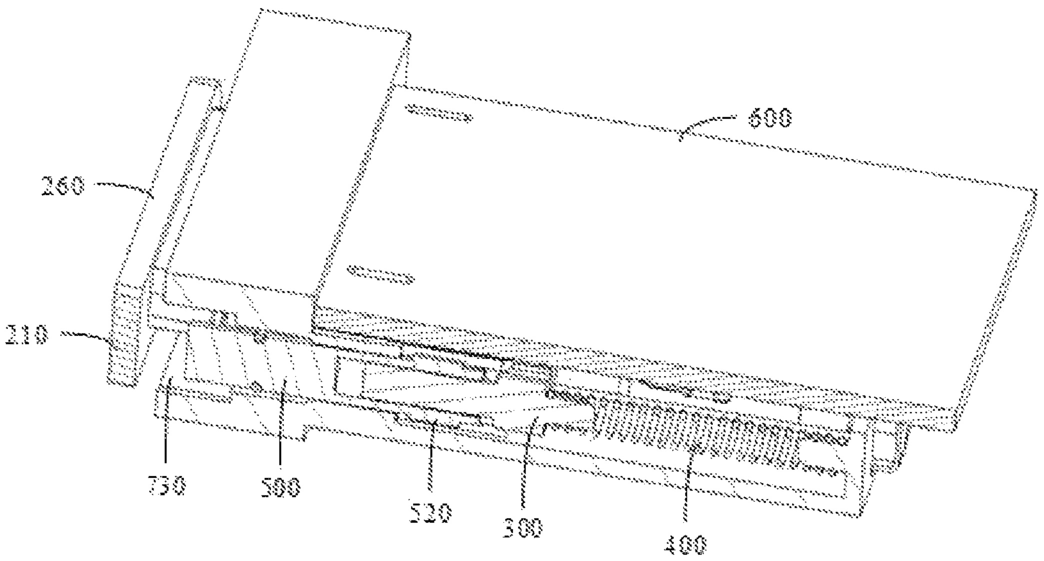
FIG. 3 is a cross-sectional view of FIG. 1.

Reference signs are described as follows:

100. positioning cylinder; 110. first fitting slot; 120. second fitting slot; 130. first guide slope;

200. card tray; 210. action portion; 220. second locking portion; 230. fourth locking portion; 240. first surface; 250. side surface; 260. positioning end portion;

300. telescopic positioning member; 310. positioning protrusion; 320. third locking portion; 330. first cylinder;

400. elastic member;

500. telescopic drive member; 510. second guide slope; 520. guide protrusion;

600. card holder; 610. first locking portion;

700. housing; 710. first accommodating hole; 720. second accommodating hole; 730. third accommodating hole; 740. avoidance portion; and 750. second cylinder.

DETAILED DESCRIPTION

The following clearly describes the technical solutions in the embodiments of this application with reference to the accompanying drawings in the embodiments of this application. Apparently, the described embodiments are only some rather than all of the embodiments of this application. All other embodiments obtained by persons of ordinary skill in the art based on the embodiments of this application without creative efforts shall fall within the protection scope of this application.

The terms "first", "second", and the like in this specification and claims of this application are used to distinguish between similar objects rather than to describe a specific order or sequence. It should be understood that terms used in this way are interchangeable in appropriate circumstances such that the embodiments of this application can be implemented in an order other than those illustrated or described herein. In addition, "and/or" in the specification and claims represents at least one of connected objects, and the character "/" generally indicates that the associated objects have an "or" relationship.

With reference to the accompanying drawings, a card tray assembly and an electronic device provided in the embodiments of this application are described below in detail by using specific embodiments and application scenarios thereof.

Referring to FIGS. 1 to 16, an embodiment of this application discloses a card tray assembly. The card tray assembly can be used as a part of the electronic device to bear a card of the electronic device and disposed at a card tray hole provided in a housing 700 of the electronic device. The card tray assembly includes a positioning cylinder 100, a card tray 200, and a telescopic assembly. The positioning cylinder 100 may be fixed, and both the card tray 200 and the telescopic assembly can be retracted and extended.

The positioning cylinder 100 is provided with a first fitting slot 110, a second fitting slot 120, and a first guide slope 130. The first guide slope 130 may have an inclined angle with respect to a telescopic direction of the card tray 200, and an inner surface of the first fitting slot 110 is connected to an inner surface of the second fitting slot 120 via the first guide slope 130. Optionally, in the telescopic direction of the card tray 200, length of the first fitting slot 110 is greater than length of the second fitting slot 120. The first fitting slot 110 may be a strip-shaped slot, and its extension direction is parallel to the telescopic direction of the card tray 200, and the second fitting slot 120 may be a V-shaped slot. The first fitting slot 110, the second fitting slot 120, and the first guide slope 130 may each be provided in a quantity of one or at least two. When the first fitting slot 110, the second fitting slot 120, and the first guide slope 130 are each provided in plurality, the first fitting slots 110 and the second fitting slots 120 are alternately arranged along a circumferential direction of the positioning cylinder 100, and any adjacent first fitting slot 110 and second fitting slot 120 are connected via the first guide slope 130.

The card tray 200 is provided with an action portion 210. When subjected to a force from a user, the card tray 200 moves, and the action portion 210 comes into contact with the telescopic assembly so as to apply a force to the telescopic assembly, thus allowing the telescopic assembly to move. Optionally, the telescopic assembly may be disposed on a side of a part of the card tray 200 for bearing the card, so that the side space of the card tray 200 can be used for arranging the telescopic assembly. The card tray assembly may further include a card holder 600. The card holder 600 may be provided with a circuit region, and the card on the card tray 200 may fit with the circuit region, so as to implement communication connection between the card and a circuit board of the electronic device.

The telescopic assembly includes a telescopic positioning member 300 and an elastic member 400. The telescopic positioning member 300 is movably disposed at the positioning cylinder 100, the telescopic positioning member 300 is at least partially located in the positioning cylinder 100, the telescopic positioning member 300 is provided with a positioning protrusion 310, and the positioning protrusion 310 may be disposed on an outer peripheral surface of the telescopic positioning member 300 and exceed the outer peripheral surface. One end of the elastic member 400 is connected to the telescopic positioning member 300, and the other end of the elastic member 400 is a fixed end. Optionally, the elastic member 400 may be a spring, and an extension direction of the elastic member 400 may be parallel to the telescopic direction of the card tray 200.

Under fitting between the positioning protrusion 310 and the first guide slope 130, the action portion 210 and the elastic member 400 drive the telescopic positioning member 300 to rotate between a first position and a second position. To be specific, when the action portion 210 applies a force to the telescopic positioning member 300, the elastic member 400 applies a force to the telescopic positioning member 300 at the same time. In this case, if the positioning protrusion 310 fits with the first guide slope 130, under the action of forces in opposite directions jointly applied by the action portion 210 and the elastic member 400, the telescopic positioning member 300 rotates between the first position and the second position, so as to switch between a state of fitting with the first fitting slot 110 and a state of fitting with the second fitting slot 120.

In a case that the telescopic positioning member 300 is at the first position, the positioning protrusion 310 fits with the first fitting slot 110 in a limiting manner, and the card tray 200 is in an extended state. The extended state herein refers to a state in which the card tray 200 is at least partially located outside the housing 700. In this state, the user can remove the card from the card tray 200 or mount the card on the card tray 200. In a case that the telescopic positioning member 300 is at the second position, the positioning protrusion 310 fits with the second fitting slot 120 in a limiting manner, and the card tray 200 is in a retracted state. The retracted state herein refers to a state in which the card tray 200 is in the housing 700.

In this embodiment of this application, the telescopic positioning member 300 is provided with the positioning protrusion 310 capable of separately fitting with the first fitting slot 110 and the second fitting slot 120 in a limiting manner. Therefore, when a user applies a force to the card tray 200, the action portion 210 of the card tray 200 and the elastic member 400 jointly apply forces to the telescopic positioning member 300. When the action portion 210 applies a larger force to the telescopic positioning member 300, the telescopic positioning member 300 moves, allowing the positioning protrusion 310 to be gradually separated from the first fitting slot 110 and fit with the first guide slope 130, such that the telescopic positioning member 300 is driven to rotate under the joint action of the elastic member 400, thus allowing the positioning protrusion 310 to fit with the second fitting slot 120 in which case the card tray 200 is in the retracted state. When the user presses the card tray 200 again, the telescopic positioning member 300 moves, allowing the positioning protrusion 310 to be gradually separated from the second fitting slot 120 and fit with the first guide slope 130, such that the telescopic positioning member 300 is driven to rotate under the joint action of the elastic member 400, thus allowing the positioning protrusion 310 to fit with the first fitting slot 110, in which case the card tray 200 is in the extended state. It can be seen that after such structure is used, the user only needs to apply a force to the card tray 200 to implement mounting and removal of the card tray 200 without the assistance of an ejection pin or a similar tool, and therefore this embodiment makes it more convenient to remove the card tray 200.

Further, in an optional embodiment, the telescopic assembly further includes a telescopic drive member 500, where the telescopic drive member 500 is movably disposed at the positioning cylinder 100, and the telescopic drive member

500 is at least partially located in the positioning cylinder 100. One end of the telescopic positioning member 300 back away from the elastic member 400 may be located in the telescopic drive member 500, and the action portion 210 faces an end surface of the telescopic drive member 500. The telescopic drive member 500 is provided with a second guide slope 510, and the first guide slope 130 and the second guide slope 510 are both located on a same side of the positioning protrusion 310 and may fit with the positioning protrusion 310 simultaneously. Optionally, the second guide slope 510 may include multiple V-shaped surfaces connected one by one and arranged along a circumferential direction of the telescopic drive member 500, and the second guide slope 510 may fit with the positioning protrusion 310 all the time. Under fitting between the positioning protrusion 310 and the first guide slope 130 and between the positioning protrusion 310 and the second guide slope 510, the action portion 210 and the elastic member 400 drive the telescopic positioning member 300 to rotate between the first position and the second position.

To more reliably limit the rotation of the telescopic drive member 500, one or more guide protrusions 520 may be disposed on an outer peripheral surface of the telescopic drive member 500. The guide protrusion 520 can fit with the first fitting slot 110, thus limiting the rotation of the telescopic drive member 500 via the first fitting slot 110.

Figure 4:
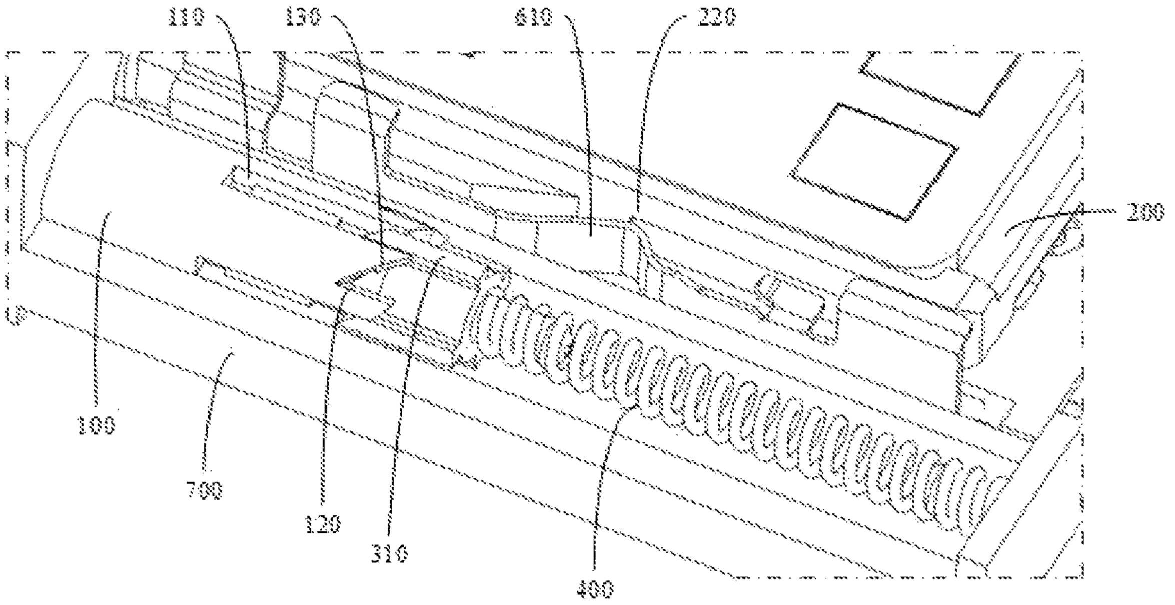
FIGS. 4 to 12 are schematic diagrams of a partial structure, in different states, of the electronic device according to the first embodiment of this application.
Figure 5:
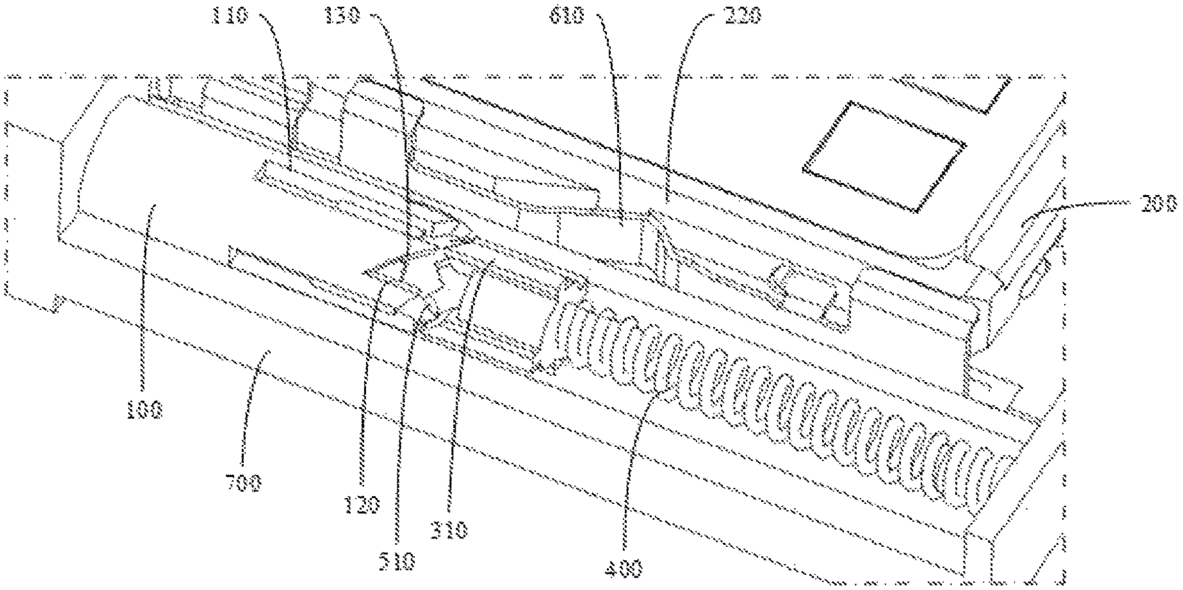
Figure 6:
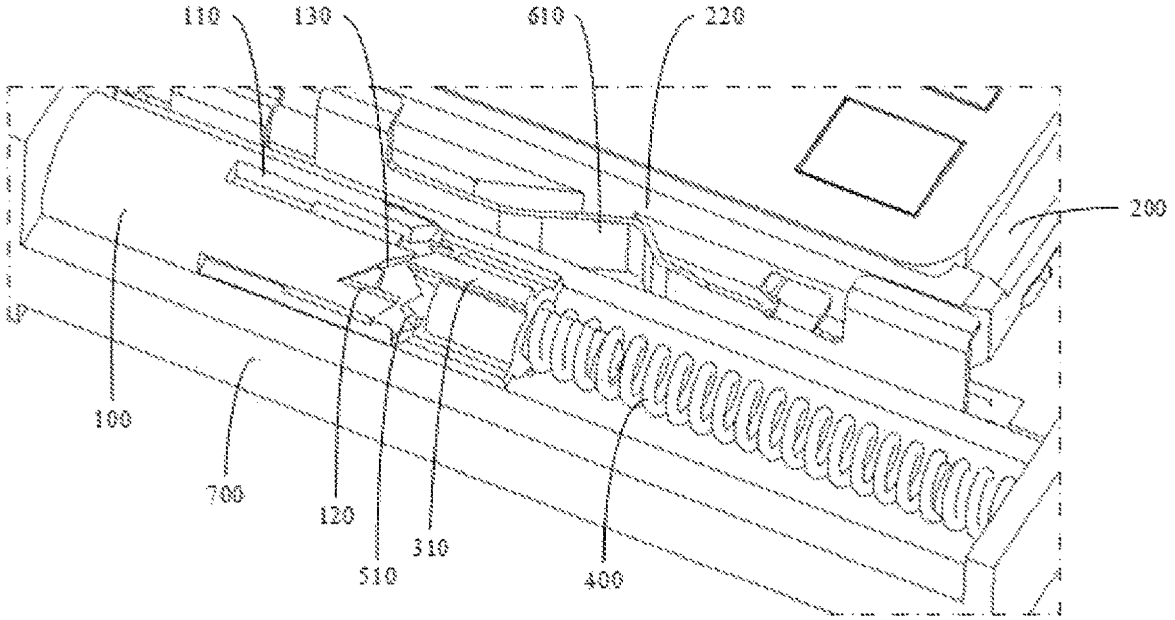
Figure 7:
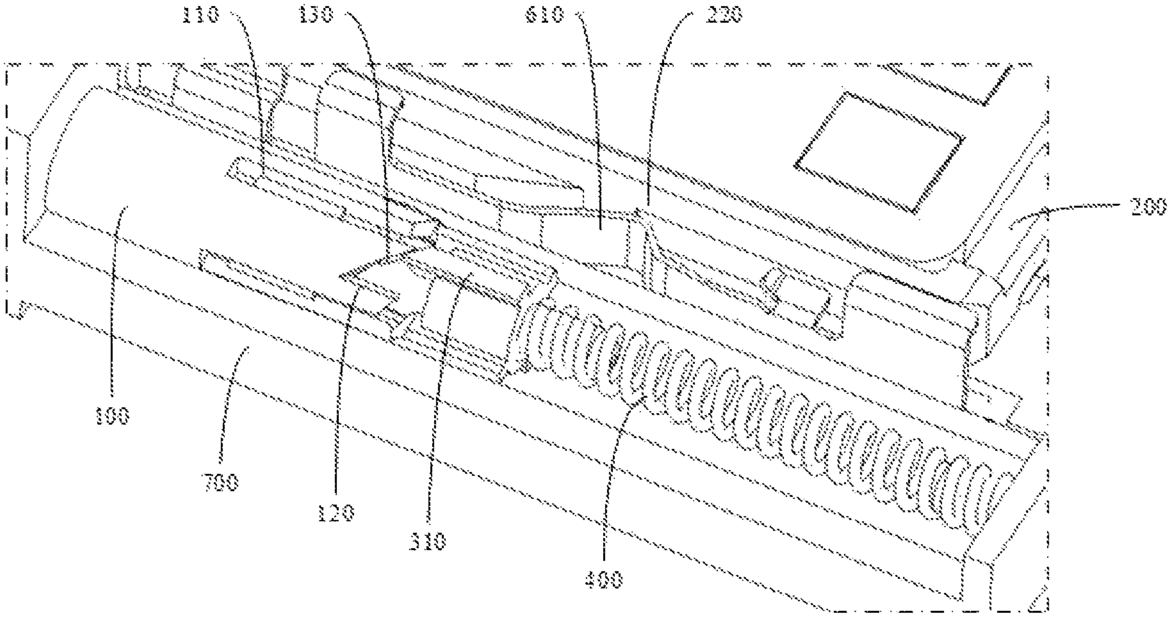
Figure 8:
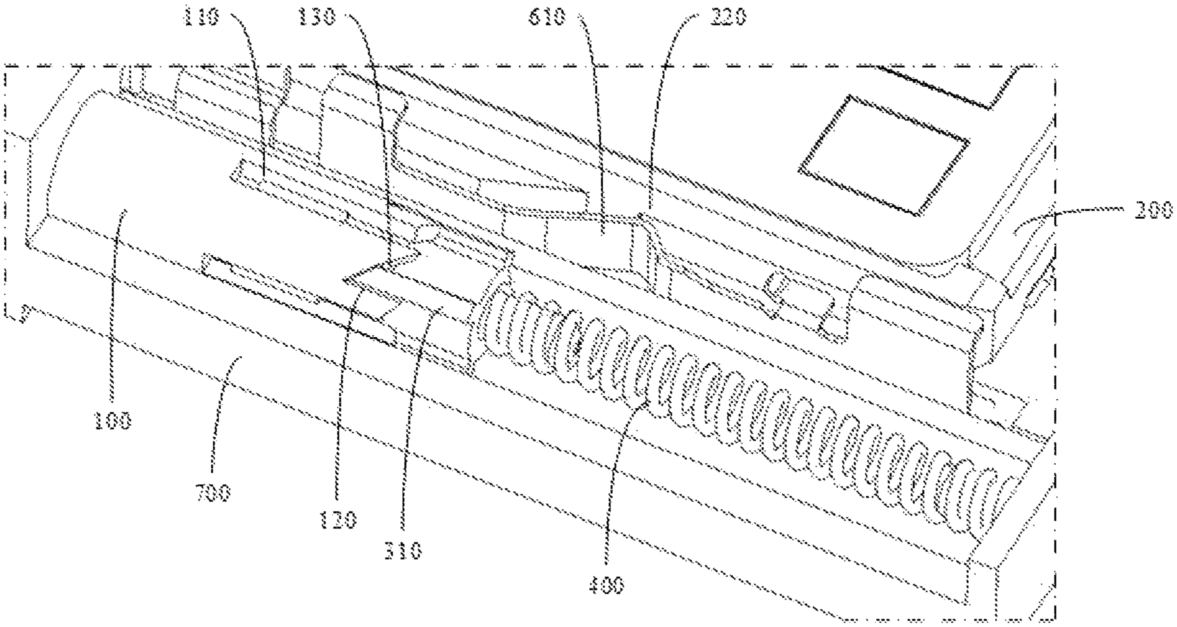

When the card tray 200 is in the extended state, the positioning protrusion 310 fits with the first fitting slot 110. When the user presses the card tray 200 to apply a force to the telescopic drive member 500 via the action portion 210, as shown in FIG. 4, the positioning protrusion 310 is gradually separated from a bottom surface of the first fitting slot 110 until the positioning protrusion 310 reaches the state of being completely separated from the first fitting slot 110 as shown in FIG. 5. In this case, the first fitting slot 110 no longer limits the position of the telescopic positioning member 300. Because the second guide slope 510 still fits with the positioning protrusion 310 and the elastic member 400 applies a force to the telescopic positioning member 300, the telescopic positioning member 300 rotates to be in the state shown in FIG. 6. In this case, the user no longer presses the card tray 200. The elastic member 400 drives the telescopic positioning member 300 and the telescopic drive member 500 to move along an extension direction of the card tray 200, so as to reach the state shown in FIG. 7 in which the positioning protrusion 310 fits with the first guide slope 130. Under the action of the elastic member 400, the telescopic positioning member 300 continues to rotate, so as to fit with the second fitting slot 120, which is the state shown in FIG. 8. Because of the limiting of the second fitting slot 120, the elastic member 400 no longer applies a force to the card tray 200, and the card tray 200 can be maintained in the retracted state.

Figure 9:
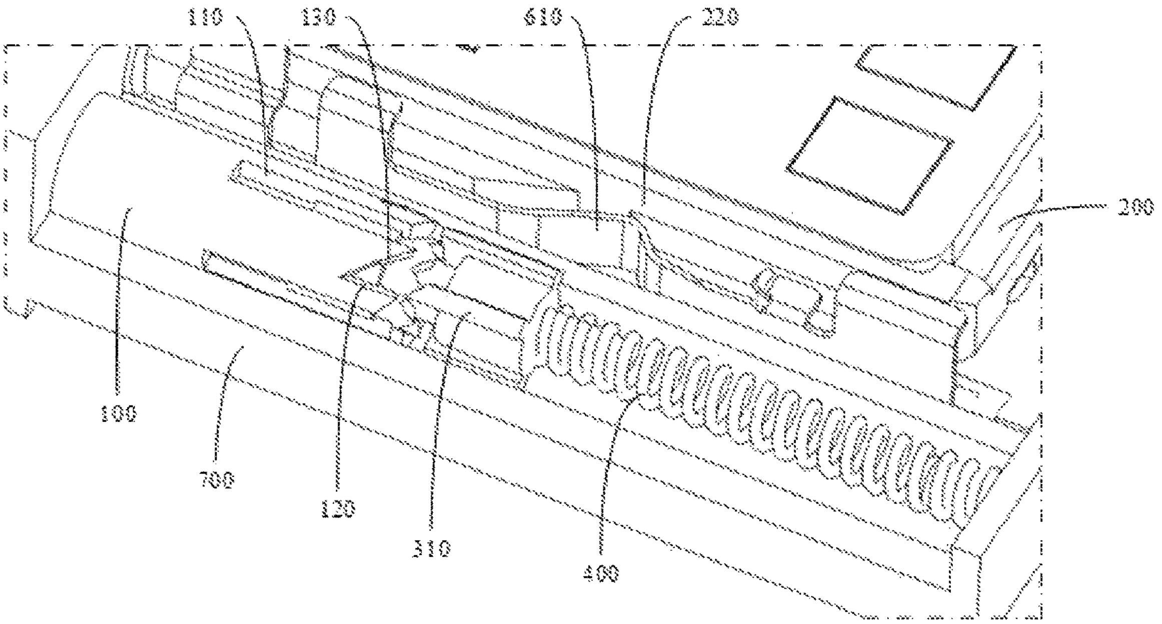
Figure 10:
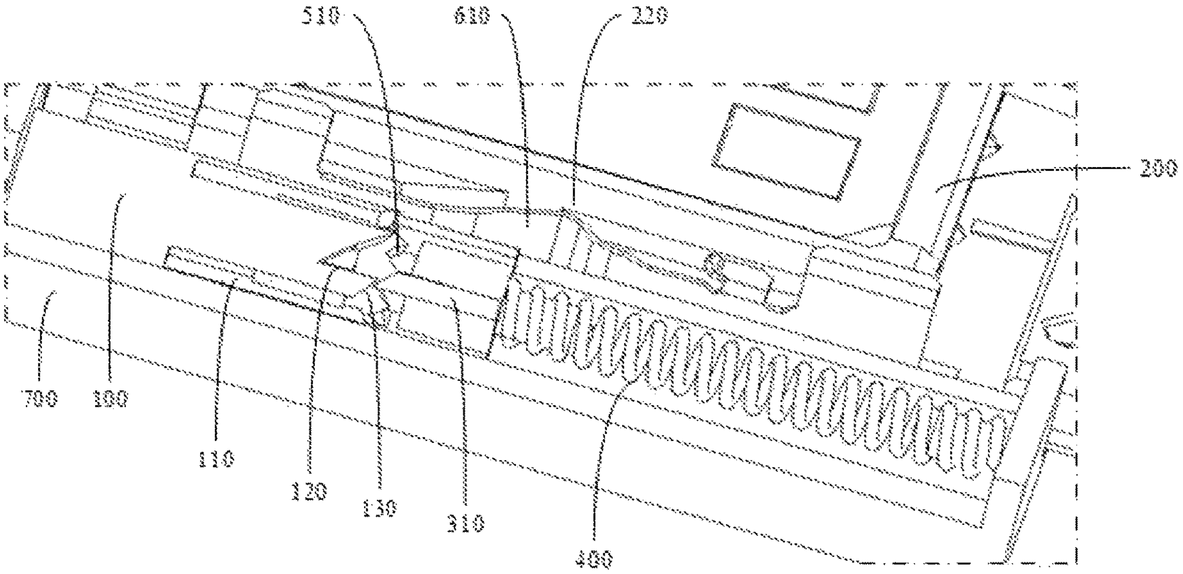
Figure 11:
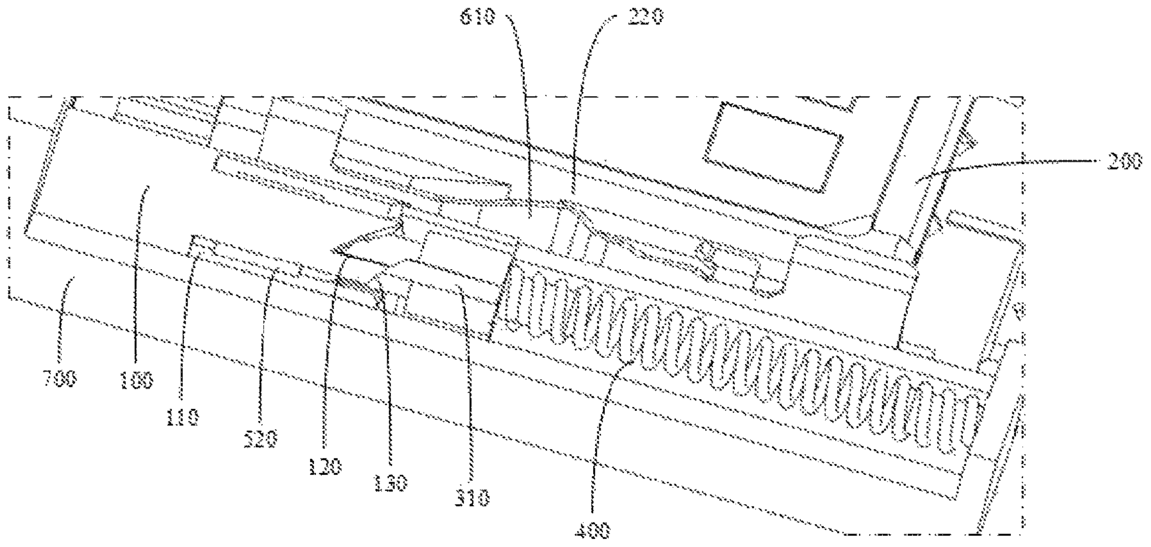
Figure 12:
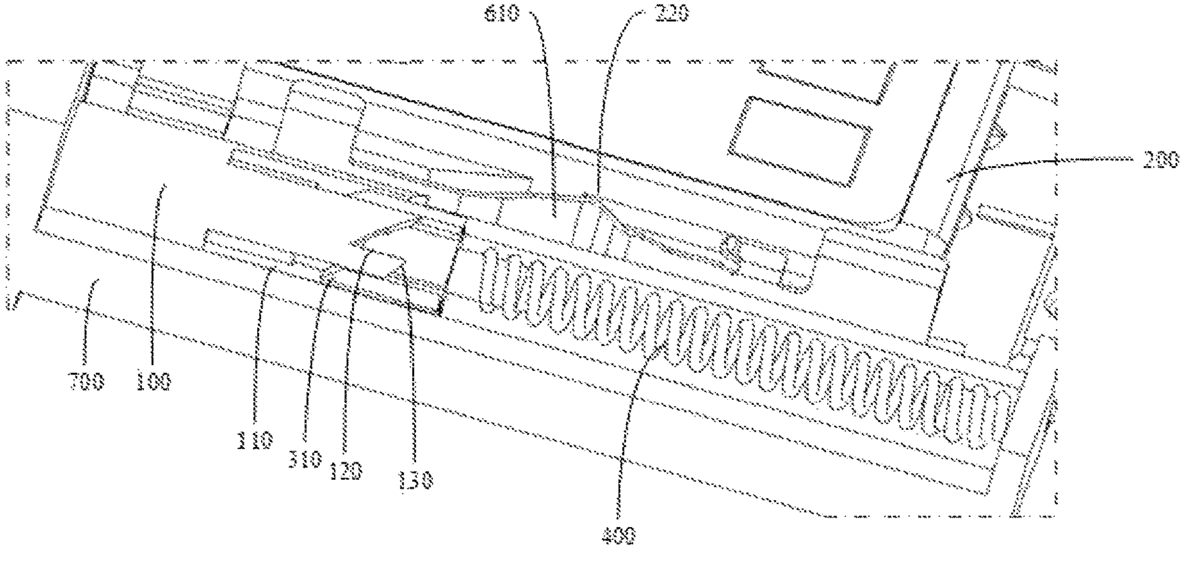
Figure 13:
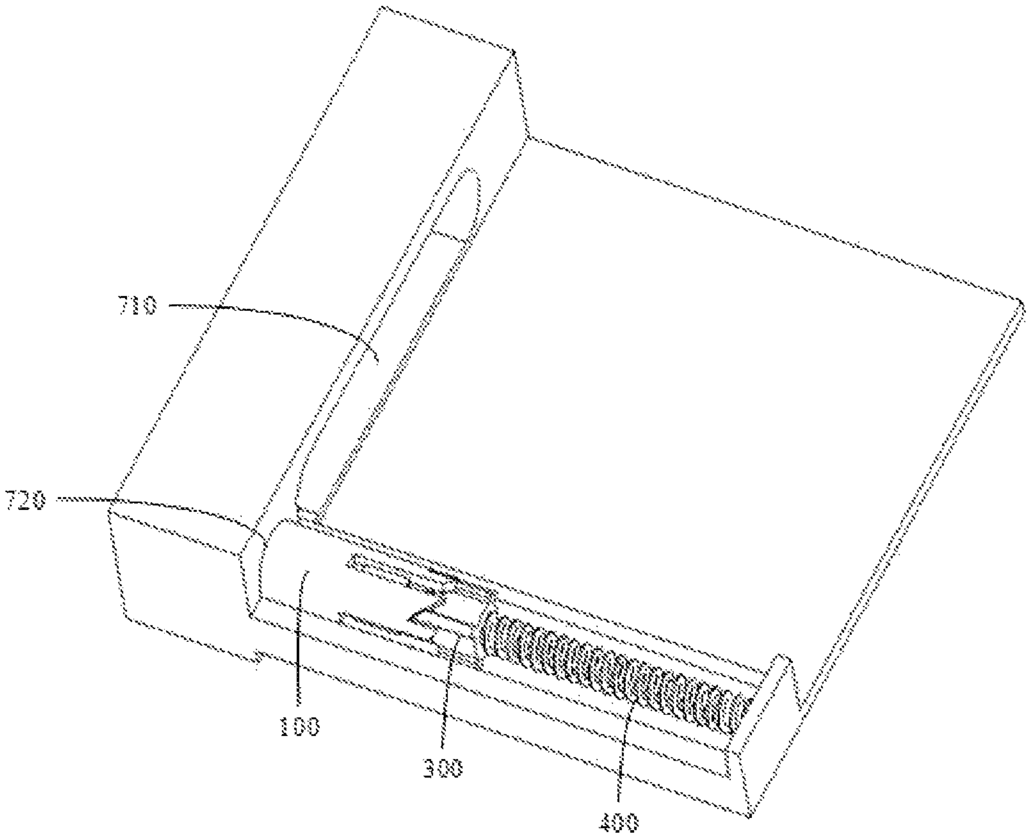
FIG. 13 is a schematic diagram of the structure, without a card holder, shown in FIG. 1.
Figure 14:
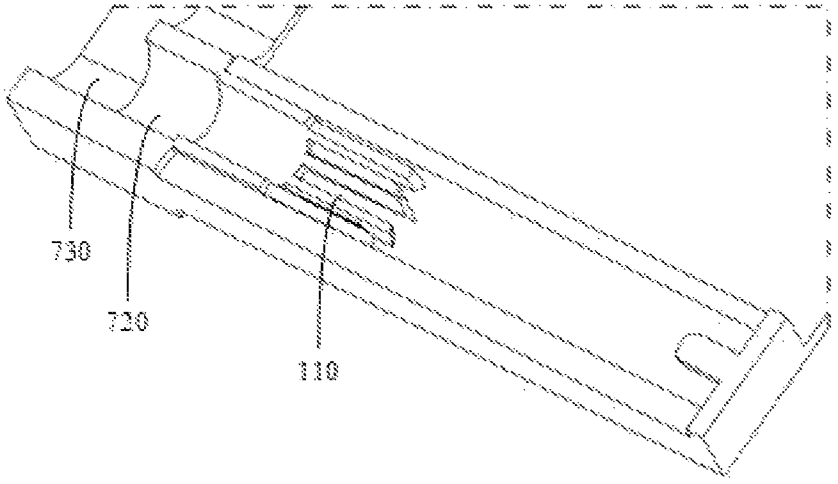
FIG. 14 is a schematic diagram of a partial structure of a housing and a positioning cylinder according to the first embodiment of this application.
Figure 15:
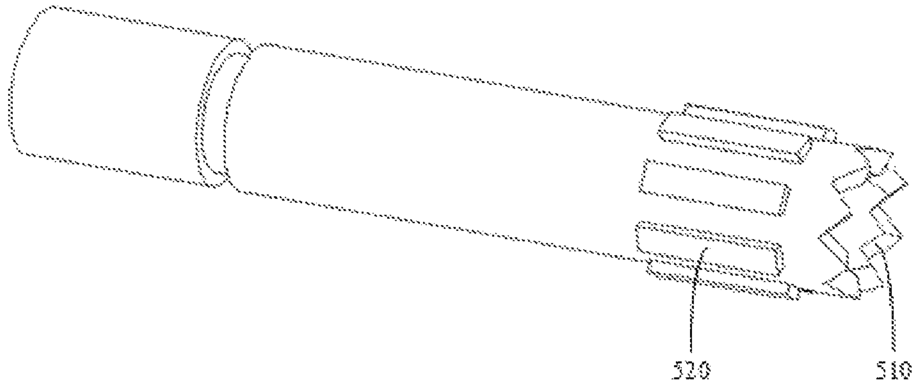
FIG. 15 is a schematic structural diagram of a telescopic drive member according to the first embodiment of this application.
Figure 16:
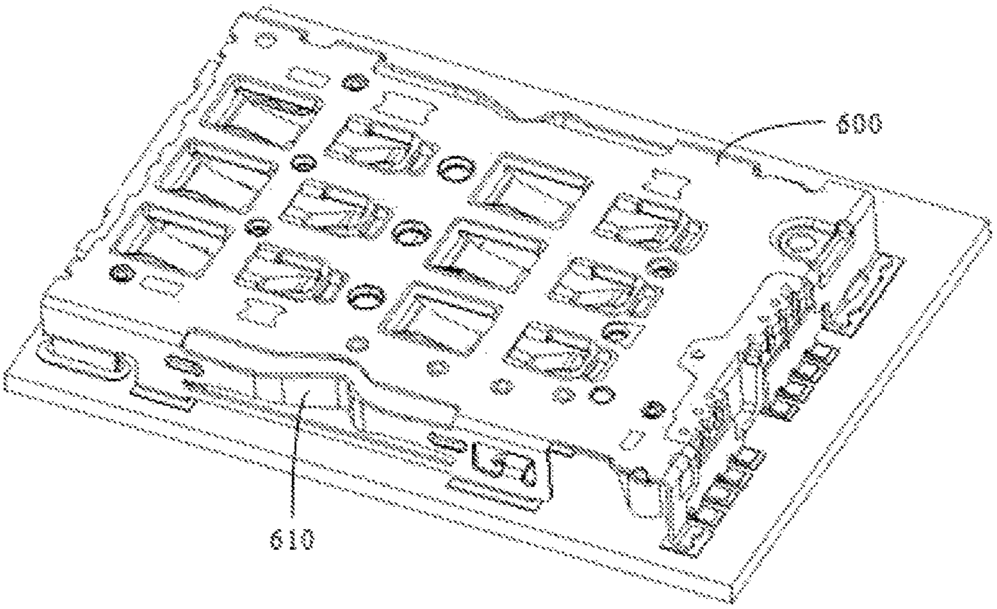
FIG. 16 is a schematic structural diagram of a card holder according to the first embodiment of this application.

When needing to eject the card tray 200, the user presses the card tray 200 in the same way, so as to apply a force to the telescopic drive member 500 via the action portion 210, allowing the positioning protrusion 310 to be gradually separated from a bottom surface of the second fitting slot 120 until the positioning protrusion 310 reaches the state of being completely separated from the second fitting slot 120 as shown in FIG. 9. In this case, the second fitting slot 120 no longer limits the position of the telescopic positioning member 300. Because the second guide slope 510 still fits with the positioning protrusion 310 and the elastic member 400 applies a force to the telescopic positioning member 300, the telescopic positioning member 300 rotates to be in the state shown in FIG. 10. In this case, the user no longer presses the card tray 200. The elastic member 400 drives the telescopic positioning member 300 and the telescopic drive member 500 to move along an extension direction of the card tray 200, so as to reach the state shown in FIG. 11 in which the positioning protrusion 310 fits with the first guide slope 130. Under the action of the elastic member 400, the telescopic positioning member 300 continues to rotate, so as to gradually enter the first fitting slot 110, which is the state shown in FIG. 12, until the positioning protrusion 310 fits with the bottom surface of the first fitting slot 110. Because of the limiting of the first fitting slot 110, the elastic member 400 no longer applies a force to the card tray 200, and the card tray 200 can be maintained in the extended state.

As compared with the solution in which the action portion 210 directly applies a force to the telescopic positioning member 300, after added, the telescopic drive member 500 can apply a force to the telescopic positioning member 300 via the second guide slope 510, thus jointly generating an action with the elastic member 400, so as to more reliably drive the telescopic positioning member 300 to rotate. A situation barely occurs in which the telescopic positioning member 300 cannot reliably rotate after separated from the first guide slope 130, and therefore this embodiment facilitates quicker and more convenient removal and mounting of the card tray 200 by the user.

When the positioning protrusion 310 fits with the second fitting slot 120, the elastic member 400 no longer applies a force to the card tray 200. In addition, a frictional force between the card tray 200 and components such as the housing 700 enables the card tray 200 to be still maintained in the retracted state. However, the frictional force cannot be excessively large, otherwise, a problem that the card tray 200 cannot be reliably maintained in the retracted state exists. To solve the problem, the card holder 600 may be provided with a first locking portion 610, and the card tray 200 may be provided with a second locking portion 220. In the case that the telescopic positioning member 300 is at the second position, the first locking portion 610 fits with the second locking portion 220 in a limiting manner. Optionally, one of the first locking portion 610 and the second locking portion 220 is a protrusion, and the other is a groove, thus realizing limiting with a simple structure. When the user no longer applies a force to the card tray 200 and the elastic member 400 is not capable of applying a force to the card tray 200 either, the first locking portion 610 can fit with the second locking portion 220 in a limiting manner, such that the card tray 200 is unlikely to change position so as to be reliably maintained in the retracted state. When the user wants to remove the card tray 200, the force applied by the user is sufficient for canceling out the force between the first locking portion 610 and the second locking portion 220, thus relieving the fitting between the first locking portion 610 and the second locking portion 220, allowing for subsequent operations.

Optionally, the entire telescopic assembly may be located on one side of the card holder 600, but for sufficient use of the space around the card holder 600, it is possible that the telescopic assembly and the card holder 600 at least partially overlap in a direction perpendicular to a plane on which the card tray 200 is located. To be specific, in the direction perpendicular to the plane on which the card tray 200 is located, an orthographic projection of the card holder 600 at least partially overlaps an orthographic projection of the telescopic assembly. Such arrangement allows for sufficient use of the space above or below the card holder 600, allowing for smaller space additionally occupied by the telescopic assembly and more compact structure of the entire card tray assembly.

Figure 17:
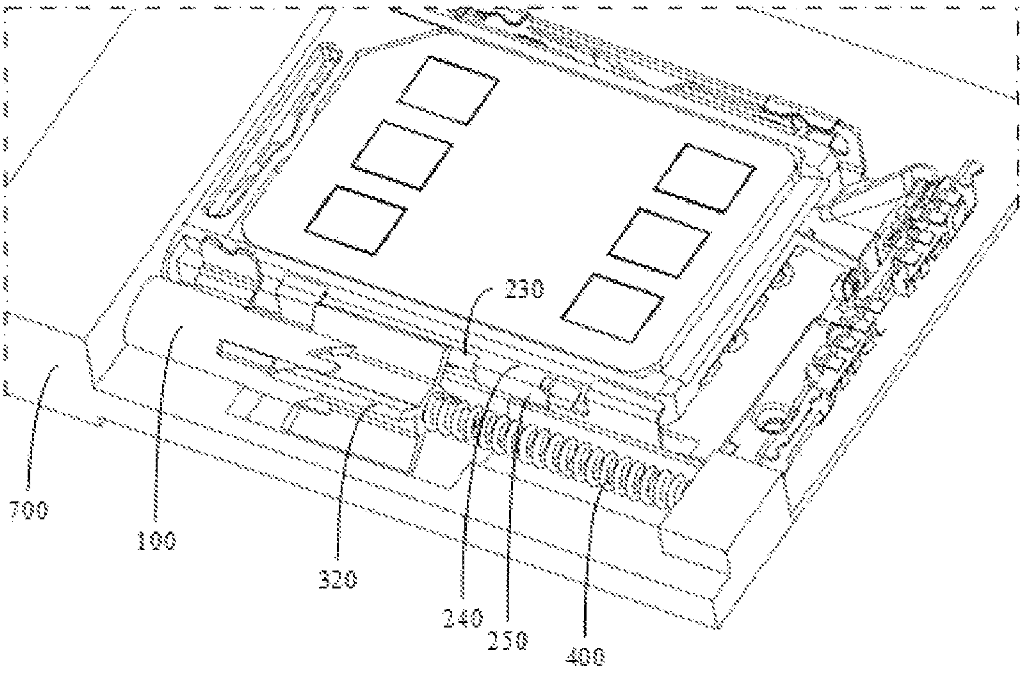
FIGS. 17 and 18 are schematic diagrams of a partial structure, in different states, of an electronic device according to a second embodiment of this application.
Figure 18:
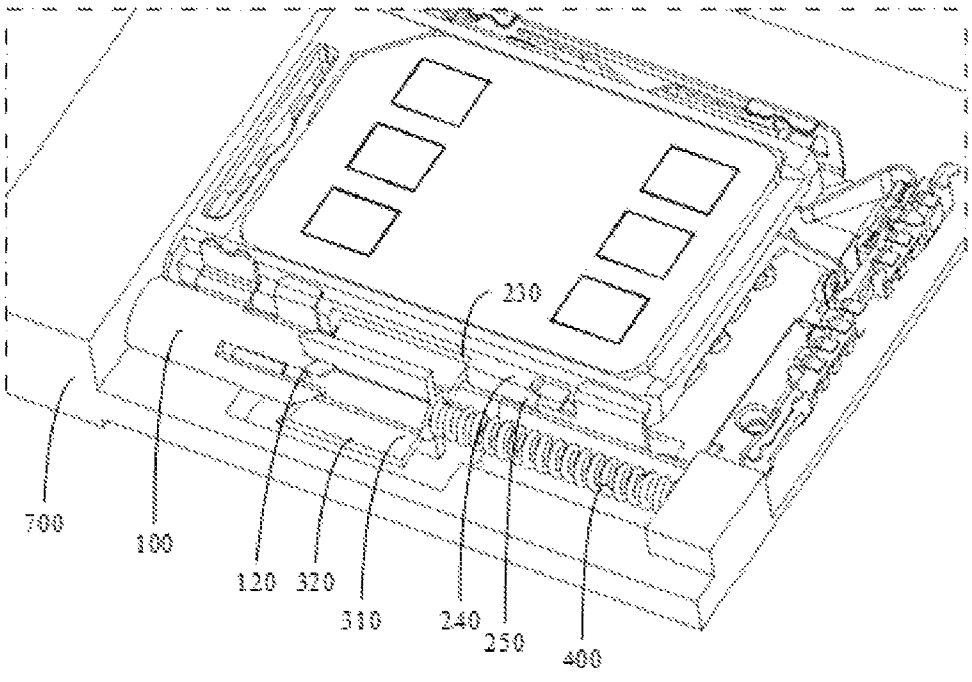
Figure 19:
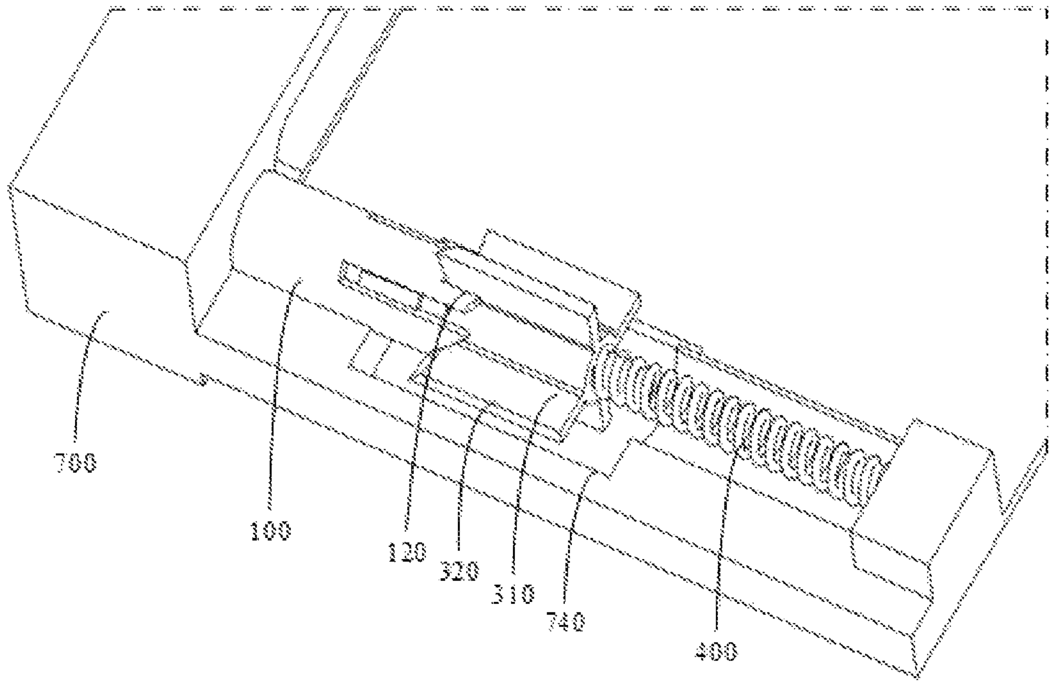
FIG. 19 is a schematic diagram of a partial structure of the structure shown in FIG. 18.

In addition to that the position of the card tray 200 is limited using the card holder 600 described above, enabling the card tray 200 to be reliably maintained in the retracted state, the position of the card tray 200 may be alternatively limited using the telescopic positioning member 300, enabling the card tray 200 to be reliably maintained in the retracted state. As shown in FIGS. 17 to 19, the telescopic positioning member 300 is provided with a third locking portion 320, the card tray 200 is provided with a fourth locking portion 230, and in the case that the telescopic positioning member 300 is at the second position, the third locking portion 320 fits with the fourth locking portion 230 in a limiting manner. When the telescopic positioning member 300 is at the second position, the second fitting slot 120 limits the position of the telescopic positioning member 300. Therefore, when the third locking portion 320 fits with the fourth locking portion 230 in a limiting manner, the card tray 200 and the telescopic positioning member 300 are maintained in a relatively still state, thus allowing the card tray 200 to be reliably maintained in the retracted state.

Comparatively, when the foregoing card holder 600 limits the position of the card tray 200, the first locking portion 610 and the second locking portion 220 can be disposed between the card holder 600 and the card tray 200, allowing for a more compact structure of the card tray assembly. When the telescopic positioning member 300 limits the position of the card tray 200, as the user presses the card tray 200, once the position of the telescopic positioning member 300 changes, the fitting between the third locking portion 320 and the fourth locking portion 230 is relieved quickly, allowing for subsequent operations. Therefore, this solution allows the user to relieve the fitting in limiting manner without the need to specially apply a force to the card tray 200 and to operate the card tray 200 more smoothly.

The third locking portion 320 and the positioning protrusion 310 may be separated, but such arrangement causes the third locking portion 320 to easily interfere with the fitting between the telescopic positioning member 300 and the positioning cylinder 100. Based on this, in another embodiment, the third locking portion 320 is integrated with the positioning protrusion 310, and the third locking portion 320 exceeds an outer peripheral surface of the positioning cylinder 100. In other words, the third locking portion 320 is stacked on a side of the positioning protrusion 310 facing away from a central line of the telescopic positioning member 300. According to this embodiment, the third locking portion 320 can be prevented from interfering with the fitting between the telescopic positioning member 300 and the positioning cylinder 100, and the stacking between the positioning protrusion 310 and the third locking portion 320 can compensate for the distance between the telescopic positioning member 300 and the card tray 200, thus making it easier to realize the fitting between the third locking portion 320 and the card tray 200 in a limiting manner.

When the third locking portion 320 is integrated with the positioning protrusion 310, because the third locking portion 320 exceeds the outer peripheral surface of the positioning cylinder 100, the housing 700 of the electronic device can be provided with an avoidance portion 740 to avoid the third locking portion 320. The avoidance portion 740 may be an avoidance slot, which can provide a movement space for the third locking portion 320.

Optionally, in the case that the telescopic positioning member 300 is at the second position, a plane on which the third locking portion 320 is located may be inclined with respect to a plane on which the card tray 200 is located. Alternatively, in the case that the telescopic positioning member 300 is at the second position, a plane on which the third locking portion 320 is located is parallel to a plane on which the card tray 200 is located. In the later embodiment, when the telescopic positioning member 300 is at the second position, in a direction perpendicular to the card tray 200, the degree of exceeding of the third locking portion 320 with respect to the card tray 200 is relatively small. Even when thickness of the third locking portion 320 is less than or equal to thickness of the card tray 200, no part of the third locking portion 320 exceeds the card tray 200, facilitating arrangement of other components around the third locking portion 320. Further optionally, when the telescopic positioning member 300 is at the first position, an angle between the plane on which the third locking portion 320 is located and the plane on which the card tray 200 is located may be 45°, or may be another degree. This is not limited in this embodiment of this application.

One of the third locking portion 320 and the fourth locking portion 230 is a protrusion, and the other is a groove, thus realizing limiting with a simple structure. Further optionally, the card tray 200 has a first surface 240 and a second surface facing away from each other and a side surface 250 connecting the first surface 240 and the second surface, and the fourth locking portion 230 is a locking slot. The telescopic positioning member 300 can rotate along a single direction, and therefore during rotation of the telescopic positioning member 300 between the first position and the second position, the third locking portion 320 runs through the locking slot. The bottom surface of the locking slot may be a curved surface, for example, an arc-shaped surface, but such locking slot brings inconvenience in processing. Therefore, the bottom surface of the locking slot is flat and the bottom surface is connected to both the first surface 240 and the second surface. In the case that the telescopic positioning member 300 is at the second position, a gap is present between the third locking portion 320 and the bottom surface. The gap can prevent the card tray 200 from interfering with the third locking portion 320, thus allowing for smoother rotation of the telescopic positioning member 300.

The bottom surface of the locking slot may be inclined. Such arrangement not only brings inconvenience in processing of the locking slot, but also results in a large gap between the bottom surface and the third locking portion 320, leading to decreased structural strength of the card tray 200. To solve these problems, the bottom surface of the locking slot is made to be perpendicular to the plane on which the card tray 200 is located, thus facilitating the processing of the locking slot, and a gap between any position of the bottom surface and the third locking portion 320 can be set within a small range, so as to enhance the structural strength of the card tray 200.

The positioning cylinder 100, the telescopic positioning member 300, the elastic member 400, and the telescopic drive member 500 may be each provided in a quantity of one group or two groups. The two groups of positioning cylinders 100, telescopic positioning members 300, elastic members 400, and telescopic drive members 500 are located on two sides of the card tray 200, so as to apply more even forces to the card tray 200, preventing the card tray 200 from being tilted during ejection.

An embodiment of this application further provides an electronic device including a housing 700 and a card tray assembly. The housing 700 is provided with a card tray hole, the card tray assembly is disposed at the card tray hole, and the card tray assembly is the card tray assembly described in any one of the foregoing embodiments. Optionally, the positioning cylinder 100 and the housing 700 may be separated or integrated. This is not limited in this embodiment of this application. Optionally, the telescopic positioning member 300 is provided with a first cylinder 330, the housing 700 is provided with a second cylinder 750, one end of the elastic member 400 sleeves the first cylinder 330, and the other end of the elastic member 400 sleeves the second cylinder 750, thus completing the mounting of the elastic member 400.

The card tray hole may be an integral connected hole. The hole corresponds to each portion of the card tray assembly, and therefore the card tray hole is large-sized, resulting in low structural strength of the housing 700. In another optional embodiment, the card tray hole may include a first accommodating hole 710, a second accommodating hole 720, and a third accommodating hole 730, where an axis of the first accommodating hole 710 is parallel to an axis of the second accommodating hole 720, and the first accommodating hole 710 communicates with the second accommodating hole 720 via the third accommodating hole 730. The card tray 200 includes a bearing portion and a positioning end portion 260. The bearing portion is configured to bear a card, the positioning end portion 260 is disposed at an end of the bearing portion, the positioning end portion 260 is a strip-shaped portion, and the action portion 210 is provided at one end of the positioning end portion 260 along its own extension direction. In the case that the telescopic positioning member 300 is at the second position, the positioning end portion 260 is in the third accommodating hole 730, the bearing portion fits with the first accommodating hole 710, and the action portion 210 faces the second accommodating hole 720. In this embodiment, a partial structure of the housing 700 is present between the first accommodating hole 710 and the second accommodating hole 720, and therefore the first accommodating hole 710, the second accommodating hole 720, and the third accommodating hole 730 are all small-sized, and the housing 700 has high structural strength.

The electronic device disclosed in this embodiment of this application may be a smartphone, a tablet computer, an e-book reader, a wearable device (for example, a smart watch), a game console, or other electronic devices. A type of the electronic device is not specifically limited in this embodiment of this application.

Embodiments of this application have been described with reference to the accompanying drawings. However, this application is not limited to the foregoing specific implementations. These specific implementations are merely for illustration rather than limitation. Inspired by this application, persons of ordinary skill in the art may develop many other forms which do not depart from the essence of this application and the protection scope of the claims, and all such forms shall fall within the protection scope of this application.

What is claimed is:

1. A card tray assembly, comprising:

a positioning cylinder, wherein the positioning cylinder is provided with a first fitting slot, a second fitting slot, and a first guide slope, and an inner surface of the first fitting slot is connected to an inner surface of the second fitting slot via the first guide slope;

a card tray, wherein the card tray is provided with an action portion; and a telescopic assembly, wherein the telescopic assembly comprises a telescopic positioning member and an elastic member, the telescopic positioning member is movably disposed at the positioning cylinder, the telescopic positioning member is at least partially located in the positioning cylinder, the telescopic positioning member is provided with a positioning protrusion, one end of the elastic member is connected to the telescopic positioning member, and the other end of the elastic member is a fixed end; wherein under fitting between the positioning protrusion and the first guide slope, the action portion and the elastic member drive the telescopic positioning member to rotate between a first position and a second position, wherein in a case that the telescopic positioning member is at the first position, the positioning protrusion fits with the first fitting slot in a limiting manner, and the card tray is in an extended state; and in a case that the telescopic positioning member is at the second position, the positioning protrusion fits with the second fitting slot in a limiting manner, and the card tray is in a retracted state;

wherein the card tray assembly further comprises a card holder, the card holder is provided with a first locking portion, the card tray is provided with a second locking portion, and in the case that the telescopic positioning member is at the second position, the first locking portion fits with the second locking portion in a limiting manner.

2. The card tray assembly according to claim 1, wherein the telescopic assembly further comprises a telescopic drive member, the telescopic drive member is movably disposed at the positioning cylinder, the telescopic drive member is at least partially located in the positioning cylinder, the action portion faces an end surface of the telescopic drive member, and the telescopic drive member is provided with a second guide slope; and under fitting between the positioning protrusion and the first guide slope and between the positioning protrusion and the second guide slope, the action portion and the elastic member drive the telescopic positioning member to rotate between the first position and the second position.

3. The card tray assembly according to claim 1, wherein in a direction perpendicular to a plane on which the card tray is located, an orthographic projection of the card holder at least partially overlaps an orthographic projection of the telescopic assembly.

4. The card tray assembly according to claim 1, wherein the telescopic positioning member is provided with a third locking portion, the card tray is provided with a fourth locking portion, and in the case that the telescopic positioning member is at the second position, the third locking portion fits with the fourth locking portion in a limiting manner.

5. The card tray assembly according to claim 4, wherein the third locking portion is integrated with the positioning protrusion, and the third locking portion exceeds an outer peripheral surface of the positioning cylinder.

6. The card tray assembly according to claim 4, wherein in the case that the telescopic positioning member is at the second position, a plane on which the third locking portion is located is parallel to a plane on which the card tray is located.

7. The card tray assembly according to claim 4, wherein the card tray has a first surface and a second surface facing away from each other and a side surface connecting the first surface and the second surface, the fourth locking portion is a locking slot, a bottom surface of the locking slot is flat, the bottom surface is connected to both the first surface and the second surface, and in the case that the telescopic positioning member is at the second position, a gap is present between the third locking portion and the bottom surface.

8. The card tray assembly according to claim 7, wherein the bottom surface is perpendicular to a plane on which the card tray is located.

9. An electronic device, comprising a housing and a card tray assembly, wherein the housing is provided with a card tray hole, the card tray assembly is disposed at the card tray hole, wherein the card tray assembly comprises:

a positioning cylinder, wherein the positioning cylinder is provided with a first fitting slot, a second fitting slot, and a first guide slope, and an inner surface of the first fitting slot is connected to an inner surface of the second fitting slot via the first guide slope;

a card tray, wherein the card tray is provided with an action portion; and a telescopic assembly, wherein the telescopic assembly comprises a telescopic positioning member and an elastic member, the telescopic positioning member is movably disposed at the positioning cylinder, the telescopic positioning member is at least partially located in the positioning cylinder, the telescopic positioning member is provided with a positioning protrusion, one end of the elastic member is connected to the telescopic positioning member, and the other end of the elastic member is a fixed end; wherein under fitting between the positioning protrusion and the first guide slope, the action portion and the elastic member drive the telescopic positioning member to rotate between a first position and a second position, wherein in a case that the telescopic positioning member is at the first position, the positioning protrusion fits with the first fitting slot in a limiting manner, and the card tray is in an extended state; and in a case that the telescopic positioning member is at the second position, the positioning protrusion fits with the second fitting slot in a limiting manner, and the card tray is in a retracted state;

wherein the card tray assembly further comprises a card holder, the card holder is provided with a first locking portion, the card tray is provided with a second locking portion, and in the case that the telescopic positioning member is at the second position, the first locking portion fits with the second locking portion in a limiting manner.

10. The electronic device according to claim 9, wherein the telescopic assembly further comprises a telescopic drive member, the telescopic drive member is movably disposed at the positioning cylinder, the telescopic drive member is at least partially located in the positioning cylinder, the action portion faces an end surface of the telescopic drive member, and the telescopic drive member is provided with a second guide slope; and under fitting between the positioning protrusion and the first guide slope and between the positioning protrusion and the second guide slope, the action portion and the elastic member drive the telescopic positioning member to rotate between the first position and the second position.

11. The electronic device according to claim 9, wherein in a direction perpendicular to a plane on which the card tray is located, an orthographic projection of the card holder at least partially overlaps an orthographic projection of the telescopic assembly.

12. The electronic device according to claim 9, wherein the telescopic positioning member is provided with a third locking portion, the card tray is provided with a fourth locking portion, and in the case that the telescopic positioning member is at the second position, the third locking portion fits with the fourth locking portion in a limiting manner.

13. The electronic device according to claim 12, wherein the third locking portion is integrated with the positioning protrusion, and the third locking portion exceeds an outer peripheral surface of the positioning cylinder.

14. The electronic device according to claim 12, wherein in the case that the telescopic positioning member is at the second position, a plane on which the third locking portion is located is parallel to a plane on which the card tray is located.

15. The electronic device according to claim 12, wherein the card tray has a first surface and a second surface facing away from each other and a side surface connecting the first surface and the second surface, the fourth locking portion is a locking slot, a bottom surface of the locking slot is flat, the bottom surface is connected to both the first surface and the second surface, and in the case that the telescopic positioning member is at the second position, a gap is present between the third locking portion and the bottom surface.

16. The electronic device according to claim 15, wherein the bottom surface is perpendicular to a plane on which the card tray is located.

17. The electronic device according to claim 9, wherein the card tray hole comprises a first accommodating hole, a second accommodating hole, and a third accommodating hole, an axis of the first accommodating hole is parallel to an axis of the second accommodating hole, and the first accommodating hole communicates with the second accommodating hole via the third accommodating hole;

the card tray comprises a bearing portion and a positioning end portion, the positioning end portion is disposed at an end of the bearing portion, the positioning end portion is a strip-shaped portion, and the action portion is provided at one end of the positioning end portion along its own extension direction; and in the case that the telescopic positioning member is at the second position, the positioning end portion is in the third accommodating hole, the bearing portion fits with the first accommodating hole, and the action portion faces the second accommodating hole.

* * * * *